United States Patent
Larson et al.

(10) Patent No.: US 6,979,165 B2
(45) Date of Patent: Dec. 27, 2005

(54) REDUCED FOOTPRINT TOOL FOR AUTOMATED PROCESSING OF MICROELECTRONIC SUBSTRATES

(75) Inventors: Robert E. Larson, Mound, MN (US); Sean D. Simondet, Shakopee, MN (US); David C. Zimmerman, Prior Lake, MN (US); Todd K. Maciej, Little Falls, MN (US); Quirin W. Matthys, St. Bonifacius, MN (US)

(73) Assignee: FSI International, Inc., Chaska, MN (US)

( * ) Notice: Subject to any disclaimer, the term of this patent is extended or adjusted under 35 U.S.C. 154(b) by 82 days.

(21) Appl. No.: 10/292,147

(22) Filed: Nov. 12, 2002

(65) Prior Publication Data

US 2003/0091410 A1 May 15, 2003

Related U.S. Application Data

(60) Provisional application No. 60/338,057, filed on Nov. 13, 2001.

(51) Int. Cl.[7] .................................................. B65H 1/00
(52) U.S. Cl. .............. 414/226.05; 414/939; 414/222.01
(58) Field of Search ................................ 414/939, 217, 414/222.01, 225.01, 226.05

(56) References Cited

U.S. PATENT DOCUMENTS

| | | | |
|---|---|---|---|
| 5,217,501 A | 6/1993 | Fuse et al. | |
| 5,376,212 A | 12/1994 | Saiki | |
| 5,435,683 A * | 7/1995 | Oosawa et al. | 414/217 |
| 6,235,634 B1 * | 5/2001 | White et al. | 438/680 |
| 6,290,405 B1 | 9/2001 | Ueda | |
| 6,313,903 B1 | 11/2001 | Ogata | |
| 6,318,944 B1 * | 11/2001 | Shimeno et al. | 414/172 |
| 6,344,126 B1 | 2/2002 | Moore | |
| 6,365,033 B1 | 4/2002 | Graham et al. | |
| 6,376,261 B1 | 4/2002 | Campbell | |
| 6,444,481 B1 | 9/2002 | Pasadyn et al. | |
| 6,572,320 B2 * | 6/2003 | Davis | 414/217 |
| 6,663,332 B1 * | 12/2003 | Sluijk et al. | 414/160 |
| 6,705,828 B2 * | 3/2004 | Soraoka et al. | 414/805 |
| 6,755,603 B2 * | 6/2004 | Yamahata | 414/225.01 |
| 6,852,644 B2 * | 2/2005 | Dickinson | 438/758 |

FOREIGN PATENT DOCUMENTS

| | | |
|---|---|---|
| EP | 0308275 | 3/1989 |
| JP | 63303060 | 12/1988 |
| WO | WO 9802910 | 1/1998 |
| WO | WO 9902436 | 1/1999 |
| WO | WO 9962107 | 12/1999 |

* cited by examiner

*Primary Examiner*—Joe Dillon, Jr.
(74) *Attorney, Agent, or Firm*—Kagan Binder, PLLC

(57) ABSTRACT

The present invention provides tools and methods of processing microelectronic substrates in which the tools maintain high throughput yet have dramatically lower footprint than conventional tools. In preferred aspects, the present invention provides novel tool designs in which multiple tool functions are overlapped in the x, y, and/or z axes of the tool in novel ways.

18 Claims, 13 Drawing Sheets

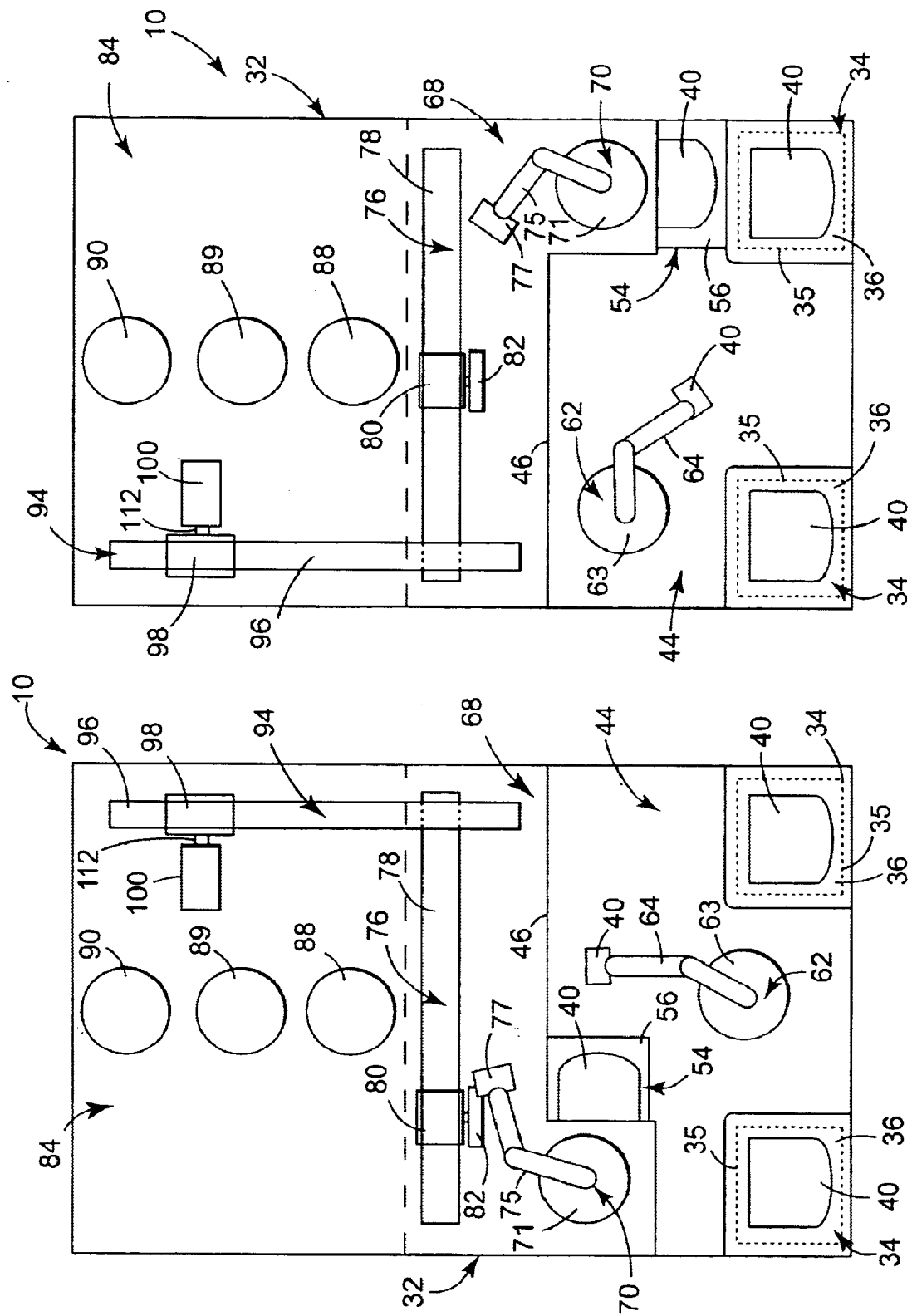

US 6,979,165 B2

REDUCED FOOTPRINT TOOL FOR AUTOMATED PROCESSING OF MICROELECTRONIC SUBSTRATES

PRIORITY CLAIM

This patent application claims priority from U.S. Provisional Patent Application No. 60/338,057, filed Nov. 13, 2001, under 35 U.S.C. §119(e), commonly owned by the assignee of the present application, the entire contents of which are incorporated herein by reference.

FIELD OF THE INVENTION

The present invention relates to automated tools used in the manufacture of microelectronic devices. More specifically, the present invention relates to such tools that incorporate tool architecture (e.g., modified floor plans) and modified componentry that allows the overall footprint of the tool to be reduced. This is accomplished, in one aspect, by tool architecture that allows tool functions to overlap in the x, y and/or z axes. In other aspects, this may be accomplished by stacking tool functions in the z axis. In other aspects, this may be accomplished by overlapping tool functions in the y axis.

BACKGROUND OF THE INVENTION

Production line(s) of automated tools are used to carry out the many steps typically required in the manufacture of microelectronic devices. A typical production line includes a series of tools set up within a fabrication facility. Processable substrates, e.g., in-process semiconductor wafers, are conveyed from tool to tool to carry out the desired sequence of process steps.

The production capacity of a fabrication facility is generally limited by the amount of useable manufacturing space in the fabrication facility. To increase production capacity, the size of the facility would have to be increased and/or the existing space would need to be used more efficiently. It is generally very capital intensive to build additional fabrication space. Thus, it is often more desirable to increase production capacity by using existing space more efficiently.

Tool footprint is one factor affecting how efficiently fabrication space is being used. Tool footprint refers to the area of floorspace used by a tool when it is set up. As between two tools that perform identical processes with the same throughput and comparable quality, the tool with the smaller footprint uses space more efficiently.

Tool throughput is another factor affecting how efficiently fabrication space is being used by a tool. For example, a tool occupying a certain amount of floorspace might be capable of processing a certain number of wafers in a given period of time, while a larger tool might be capable of processing a larger number of wafers in a given period of time. The larger tool might actually process a higher number of wafers per unit of time per unit of floorspace, making it more efficient to use in some instances. Thus, throughput and footprint often must be looked at together to assess how efficiently a tool uses fabrication floorspace.

Tools with reduced footprint and high throughput thus are desirable, as their use enhances production capacity per unit area of fabrication floorspace. Much research and development effort in the microelectronic industry is devoted to developing more space-efficient tools, and the demand for such tools remains strong.

SUMMARY OF THE INVENTION

The present invention provides tools and methods of processing microelectronic substrates in which the tools maintain high throughput yet have dramatically lower footprint than conventional tools. In preferred aspects, the present invention provides novel tool designs in which multiple tool functions are overlapped in the x, y, and/or z axes of the tool in novel ways.

The various aspects of the present invention are shown in the claims included below.

BRIEF DESCRIPTION OF THE DRAWINGS

The above mentioned and other advantages of the present invention, and the manner of attaining them, will become more apparent and the invention itself will be better understood by reference to the following description of the embodiments of the invention taken in conjunction with the accompanying drawings, wherein:

FIG. 12 is an alternative embodiment of a tool of the present invention;

FIG. 13 is an alternative embodiment of a tool of the present invention; and

DETAILED DESCRIPTION OF PRESENTLY PREFERRED EMBODIMENTS

Figure 1:
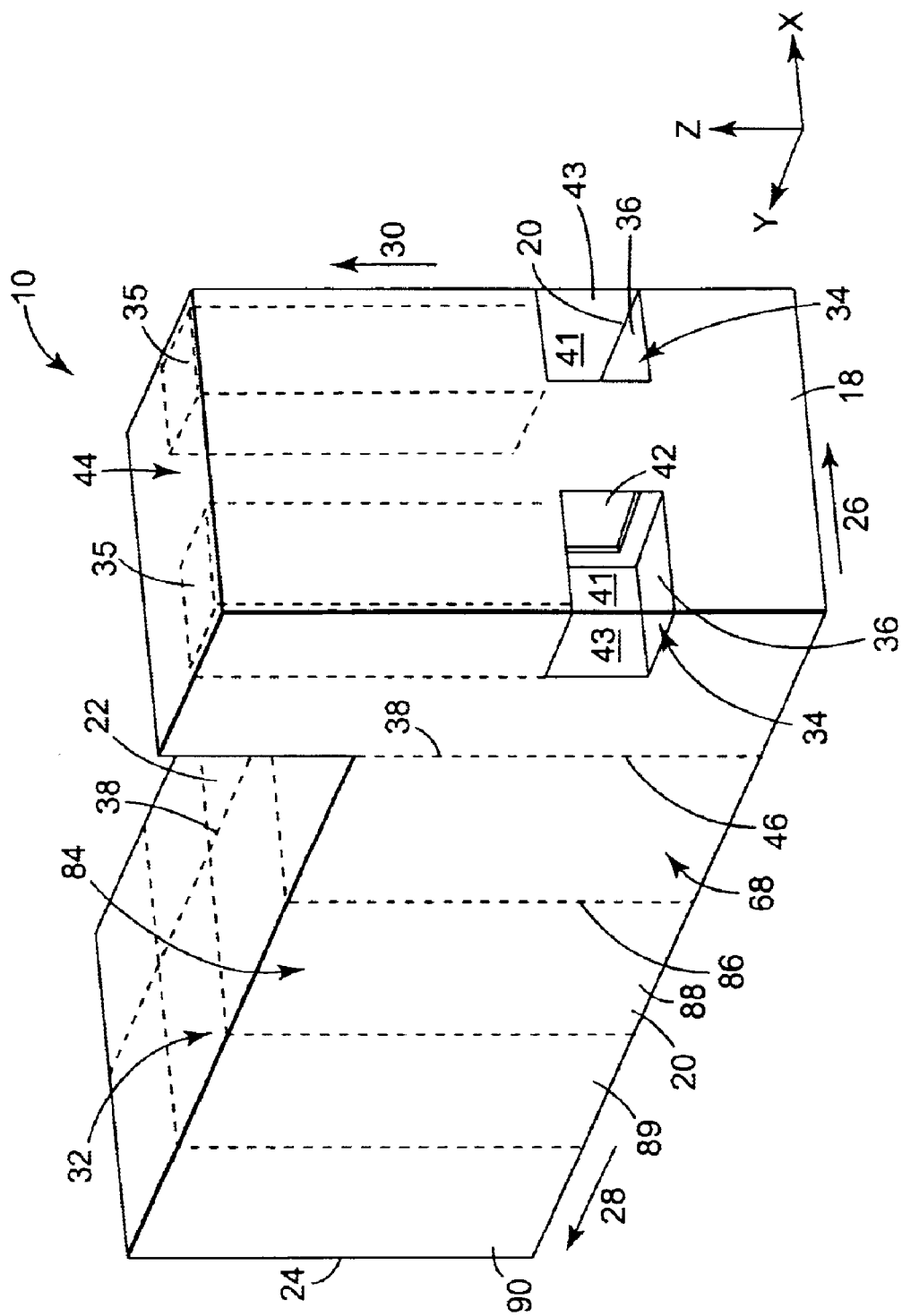
FIG. 1 is a schematic, perspective view of a tool of the present invention.
Figure 2:
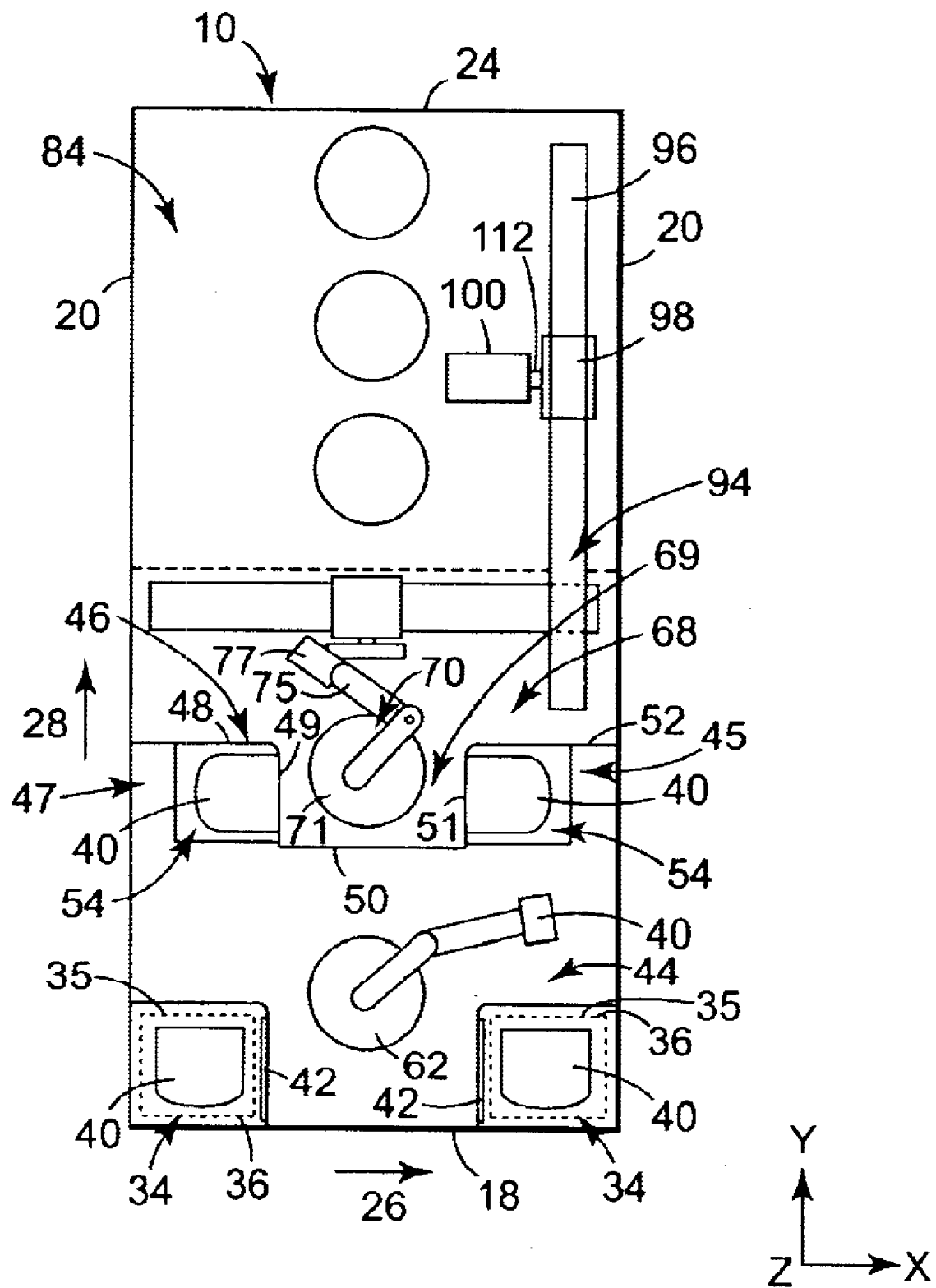
FIG. 2 is a schematic, plan view of the tool of FIG. 1 shown in a production line.
Figure 3:
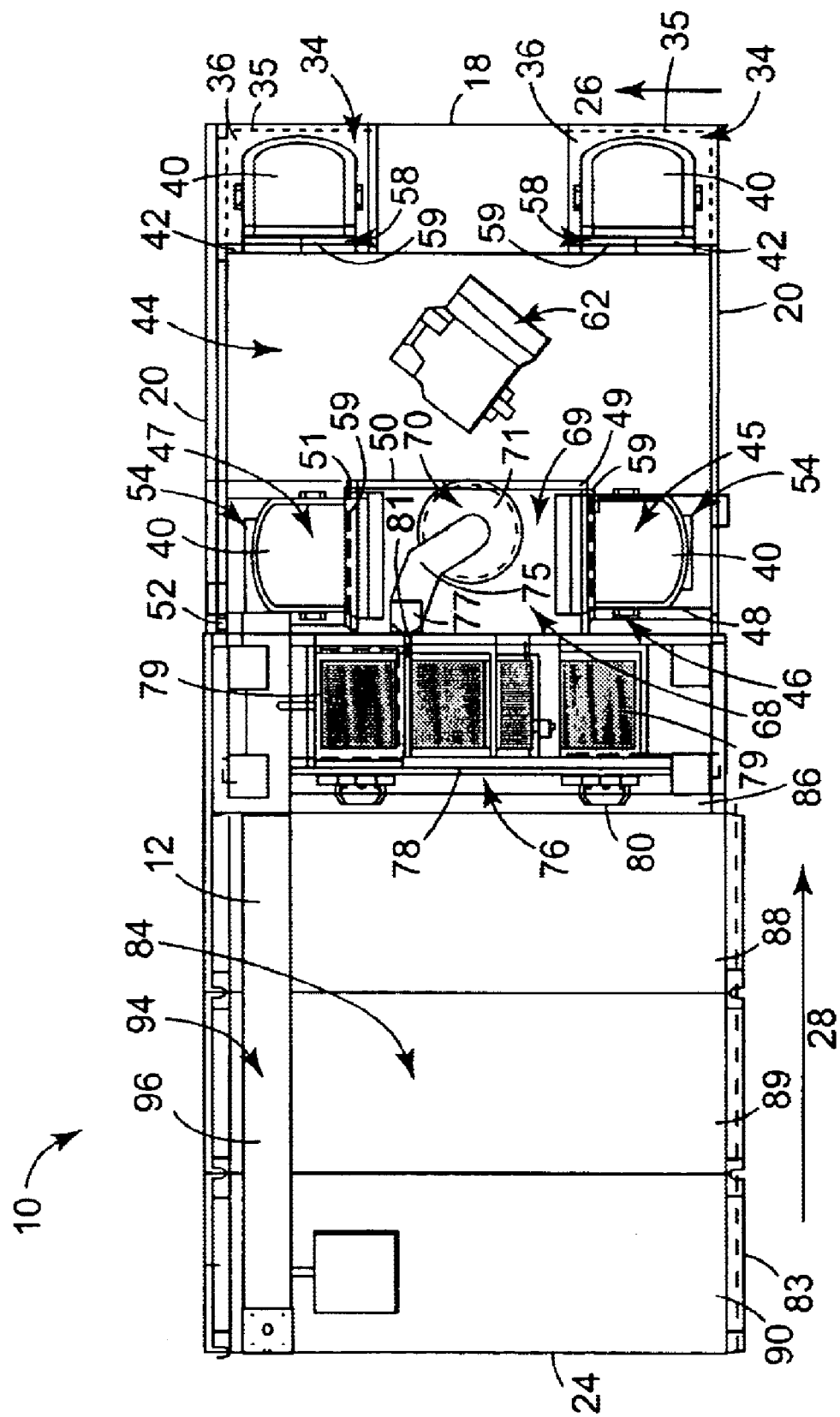
FIG. 3 is a more detailed plan view of the tool of FIG. 1, with some parts removed to more clearly show some of the layout features of the tool.
Figure 4:
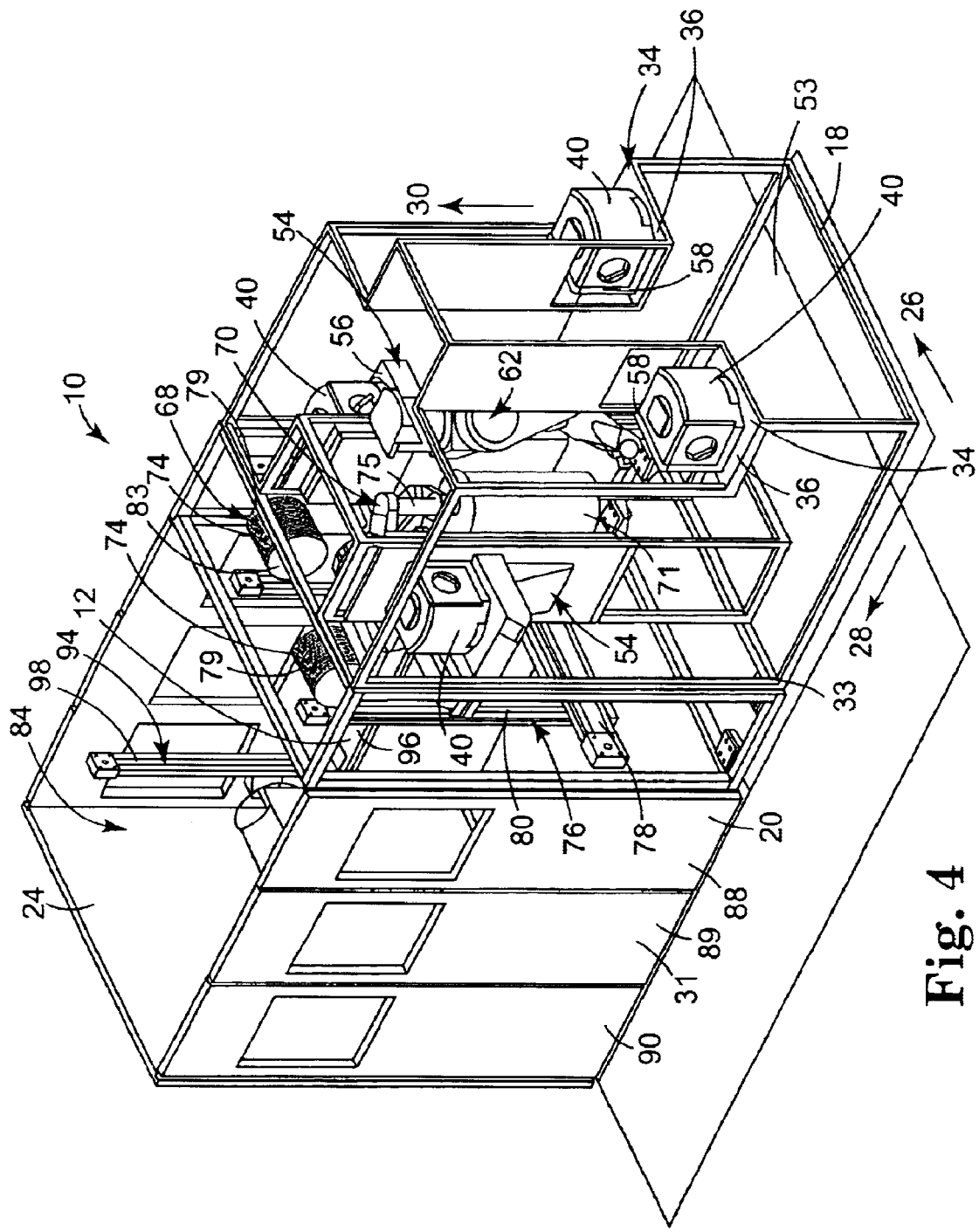
FIG. 4 is a perspective view of the tool of FIG. 1, with some parts removed, and wherein the z-axis slides of the robots 76 and 94 are shown in two positions and their respective horizontal slides.
Figure 5:
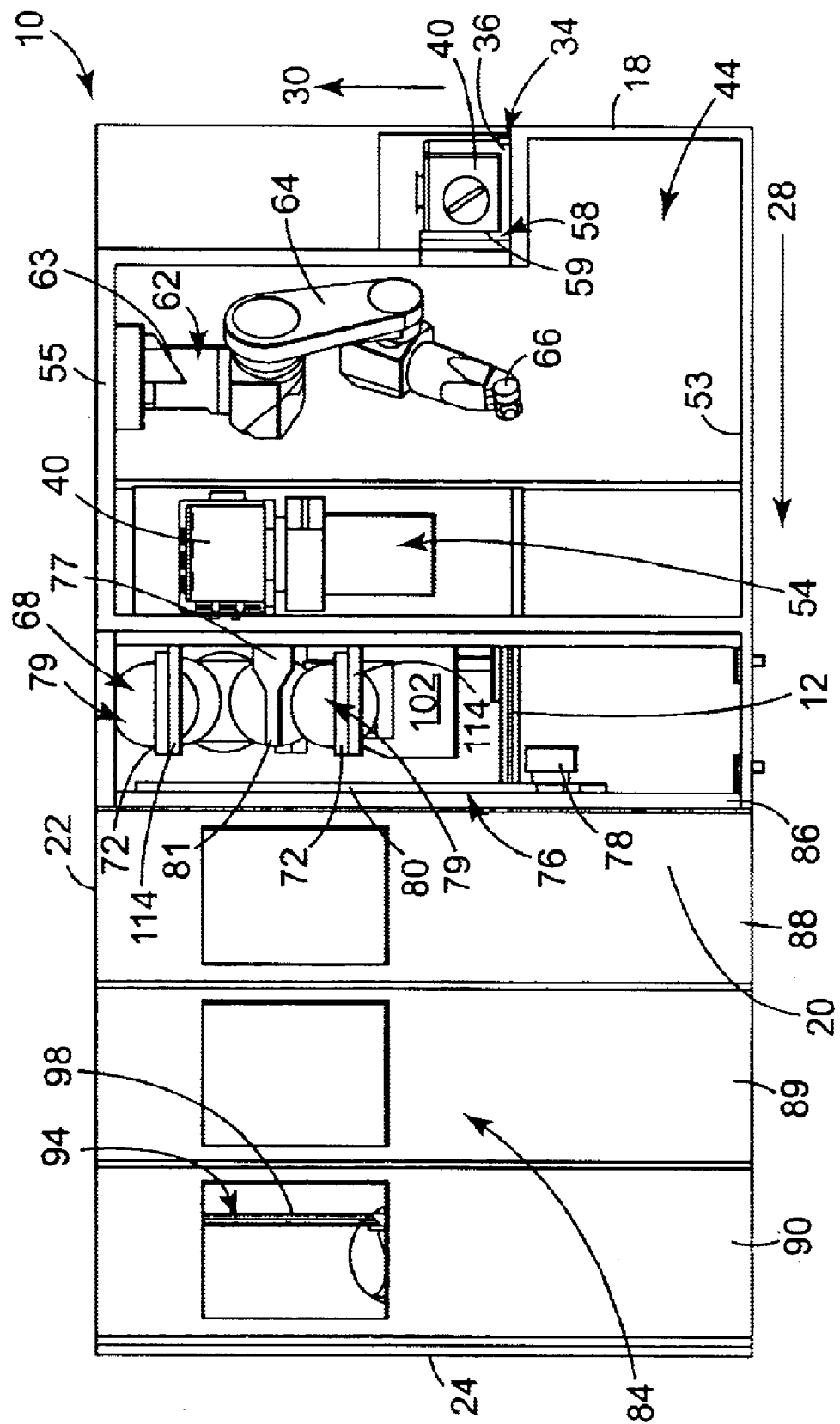
FIG. 5 is a side view of the tool of FIG. 1 with some parts removed.

The embodiments of the present invention described below are not intended to be exhaustive or to limit the invention to the precise forms disclosed in the following detailed description. Rather the embodiments are chosen and described so that others skilled in the art may appreciate and understand the principles and practices of the present invention.

A representative embodiment of a process tool 10 incorporating the principles of the present invention is shown in FIGS. 1 through 11. Process tool 10 of the invention includes housing 32 having a front side 18, sides 20, top 22, and rear 24. Housing 32 is formed from componentry including panels 31 and an underlying, supportive framework 33. Tool 10 has a width that extends along x-axis direction 26, a height that extends along z-axis direction 30; and a length that extends along y-axis direction 28. The front side 18 of tool 10 is provided with one or more interfaces through which batches of processable microelectronic substrates, typically carried in a suitable holder such as industry-standard front opening unified pods (FOUP's) 40, may be transported into and taken from tool 10. For purposes of illustration, tool 10 includes two such interfaces in the form load ports 34.

Each such load port 34 generally includes a shelf 36 on which a FOUP 40 may be placed when conveyed to and from tool 10. Placement of a FOUP 40 on shelf 36 for processing may be accomplished using overhead transport (OHT), automatic guided vehicle (AGV), personal guided vehicle (PGV), or any other suitable transport methodology. The open sides of each shelf 36 preferably are covered by a fixed and/or openable panels 41 and 43. In preferred embodiments, each of panels 41 and 43 is formed from a transparent, impact-resistant material such as polycarbonate or the like in order to allow each load port 34 to be visually inspected. It is also preferred that at least one of panels 41 or 43 for each shelf 36 be openable, e.g., by sliding downward, upward, or the like, to provide direct access to each shelf 36. A chimney 35 also provides access to each shelf 36 from above by an OHT in a conventional manner. Each load port 34 also generally includes a portal 42 providing egress to and from the interior of tool 10. Each portal 42 may optionally include a door or other suitable barrier structure (not shown) or the like in order to help isolate the interior of tool 10 for safety reasons.

When an OHT methodology is used to pick up and drop off FOUP's 40 from a loadport 34, the OHT mechanism typically conveys a FOUP 40 to and from a shelf 36 via a corresponding chimney 35. Alternatively, when other methodologies, such as AGV or PGV, are used to convey a FOUP 40 to and from a shelf 36, at least one of corresponding panels 41 and/or 43 is opened to provide access to the shelf 36. For safety reasons, while a panel 41 and/or 43 is opened in this manner, the corresponding portal 42 may be closed by a suitable structure (not shown), such as a slideable panel, hinged door, or the like.

Desirably, the load ports 34 at the front side 18 of tool 10 are positioned at a suitable height, depending upon the modes of transport to be used to convey FOUP's 40 to and from load ports 34. For example, one set of industry standards, specifies a shelf height of 900 mm when AGV or PGV modes are used. This 900 mm shelf height would also be suitable when OHT is likely to be used in combination with one or both of AGV or PGV. Thus, the desired height of shelves 36 may be determined by such practical concerns.

Tool 10 preferably includes three main sections. These are a buffer zone 44, a wafer transfer system 68, and a processing zone 84. Buffer zone 44 is positioned adjacent the front side 18 of tool 10. Buffer zone provides a workspace in which FOUP's 40 are moved to and from the interior of tool 10 through portals 42 of load ports 34. Buffer zone 44 extends from front side 18 back along the y-axis dimension 28 of tool to partition 46. Partition 46 provides a physical barrier between buffer zone 44 and wafer transfer system 68. Partition 46 allows a mini-environment to be established within wafer transfer system 68 that is isolated relative to buffer zone 44.

Partition 46 in this embodiment is formed from walls 48, 49, 50, 51, and 52. Walls 49 and 51 extend along a length of the y-axis direction 28 and thus are laterally adjacent both buffer zone 44 and wafer transfer system 68. Consequently, portions 45 and 47 of buffer zone 44 overlap portion 69 of wafer transfer system 68 in the y-axis direction. This overlap allows the overall y-axis dimension of tool 10 to be dramatically reduced relative to a conventional tool that lacks such overlap and/or allows the storage capacity within buffer zone 44 to be increased.

Walls 49 and 51 each include an interface through which substrates 74 may be transferred to and from buffer zone 44 and wafer transfer system 68. In the preferred embodiment, these interfaces are in the form of industry standard pod door opener (PDO) assemblies 54. Each PDO assembly 54 generally includes a faceplate 58 having an airlock structure 59 providing environmentally controlled egress between buffer zone 44 and wafer transfer system 68. Each PDO assembly 54 also includes a shelf 56 upon which a FOUP 40 may be positioned to operatively engage the airlock structure 59.

Each of walls 49 and 51, and hence each of faceplates 58, are generally at least substantially parallel to the y-axis direction 28, and hence at least substantially perpendicular to the x-axis direction 26. This orientation generally requires that the FOUPs 40 be rotated 90° when transferred from a loadport 34 to operatively engage one of the PDO assemblies 54. The rotation of the FOUP's 40 is handled by the buffer zone robot 62.

Whereas the height of shelves 36 may be more restricted by practical concerns, each shelf 56 of PDO assembly 54 may be positioned with much greater flexibility at any desired height within buffer zone 44 as desired. In preferred embodiments, it has been found very desirable to position each of shelves 56 above the industry standard height of 900 mm, e.g., at a height in the range of 1000 mm to 2000 mm, preferably 1300 mm to 1800 mm, more preferably about 1600 mm. Doing this creates useable space beneath the PDO assemblies 54, robot 70, robot 76, and basically all the componentry of wafer transfer system 68 that can be used to house other tool components such as robot controllers, power panels, electrical boxes, air/$N_2$ distribution panels, other process support hardware, and the like. Thus, raising the height of the shelves 56 allows multiple tool functions to be stacked over the same x-y footprint of tool 10. This is another way in which the overall footprint of tool 10 is dramatically reduced as compared to conventional tools. Raising shelves 56 also has the practical effect of allowing the deck height within the processing zone 84 to be raised without significantly increasing the z-stroke of the wafer transfer robot 70 (described further below), carrier transfer robot 76 (described further below), or process zone robot 94 (described further below). The increased deck height also creates space under the processing zone stations 88, 89, and 90 that can be used to house various kinds of tool componentry. Again, multiple tool functions are stacked in the z-axis, helping to reduce the overall x-y footprint of tool 10.

A buffer zone robot 62 is positioned inside buffer zone 44 and preferably is used at least to transport FOUPs to and from load ports 34 and any other locus within the operational range of robot 62, to and from one or more storage positions (not shown) inside of buffer zone 44 and any other locus within the operational range of robot 62, and/or to and from operative engagement with PDO assemblies 54 and any other locus within the operational range of robot 62. Robot 62 is preferably capable of sufficient multi-axis movement so that robot 62 is able to reach as many locations as possible at any of a wide desired range of x, y, and z coordinates within the volume of buffer zone 44. In actual practice, a 6-axis robot would be suitable for use as robot 62.

Robot 62 includes base 63, articulating arm 64 extending from base 63, and a suitable end effector 66 for engaging FOUPs 40; Base 63 may be mounted to the floor 53 and/or ceiling 55 of buffer zone 44, but is preferably ceiling-mounted in a preferred embodiment. Mounting the robot 62 on the ceiling 55 advantageously allows the space below the robot to be used for additional FOUP storage locations and/or other tool functions. This is another way in which multiple tool functions are stacked in the z-axis, further helping to reduce the x-y footprint of tool 10.

As used herein, the terminology "wafer transfer system" refers generally to a system incorporated into a tool or provided as an adjunct to a tool that withdraws processable substrates from one or more substrate storage devices, such as a FOUP, helps to convey the withdrawn substrates at least partially to and from a processing resource, and then returns the processed substrates to the one or more storage devices after processing. A wafer transfer system of the invention may convey wafers singly or in batches. In some embodiments, the wafer transfer system may include componentry, e.g., one or more robots, one or more carriers, or the like, that convey individual substrates or groups of substrates directly to and from a processing resource. In other embodiments, the wafer transfer system may include componentry, e.g., one or more robots, one or more carriers, one or more wafer elevators, or the like, that are used to convey batches of substrates to and from a processing resource.

As used herein, the terminology "batching station" refers generally to a location within a wafer transfer system at which a batch of two or more processable substrates is assembled by wafer transfer system componentry using substrates withdrawn from one or more storage devices. The batching station preferably is also used as a location at which a previously assembled batch of substrates is unbatched after processing by wafer transfer system componentry and returned to one or more storage devices.

A preferred embodiment of a wafer transfer system 68 is incorporated into tool 10 and is shown in FIGS. 1–11. The wafer transfer system 68 is generally positioned between at least a portion of the buffer zone 44 and at least a portion of the processing zone 84. Although tool 10 preferably includes partition 46 to environmentally isolate wafer transfer zone 68 from buffer zone 44, wafer transfer system 68 need not, if desired, include an environmental barrier between wafer transfer system 68 and processing zone 84. For purposes of illustration, however, optional partition 86 is included to provide a barrier between at least a portion of wafer transfer system 68 and processing zone 84.

Wafer transfer system 68 provides a working space in which processable substrates 74 stored in FOUPs 40 are transferred one at a time and/or in batches from one or more FOUP's 40 engaged with one or both PDO assemblies 54 to suitable carrier(s) 72 at a batching station 73. Carriers 72 may hold batches of substrates 74 during processing and/or optional storage, as desired. After processing is completed, the substrates may be transferred from the carrier(s) 72 positioned at batching station 73 back to FOUP(s) 40 engaged with PDO assembly(ies) 54. Using PDO assembly 54 as an interface for this transfer between FOUPs 40 and carriers 72 helps to protect the integrity of the environment within wafer transfer system 68 and processing zone 84.

Wafer transfer system 68 also may provide a working space in which one or more carriers 72 holding one or more processable substrates 74 can be transferred to and from processing zone 84 at a hand off station 83. Wafer transfer system 68 optionally also may provide a working space in which one or more carriers 72 holding one or more processable substrates 74 can be transferred to and from one or more storage locales located within wafer transfer system 68 and/or processing zone 84.

Wafer transfer system 68 may include any kind of componentry for handling the desired transport of substrates to and from FOUPs engaged at PDO assemblies 54, to and from carriers 72, to and from the processing zone 84, and/or to and from storage locale(s). Preferred componentry of wafer transfer system 68 includes wafer transfer robot 70 and carrier transfer robot 76. Wafer transfer robot 70 is positioned within portion 69 and includes base 71, articulating arm 75, and an end effector 77. The operational range of robot 70 extends at least from PDO assemblies 54 to the at least one batching station 73, allowing robot 70 to transfer substrates 74 between FOUPs 40 engaged at PDO assemblies 54 and carriers 72 positioned at batching station 73.

Advantageously, the wafer transfer robot 76 in this embodiment is positioned between the two opposed PDO assemblies 54 allowing robot 76 to easily transport substrates 74 between the PDO assemblies 54 and the wafer batching station 73. This configuration allows the y-axis dimensions of the PDO assemblies 54 and the y-axis dimension of the robot 76 to overlap, reducing the total y-axis dimension of tool 10 needed to accommodate these tool components. The y-axis footprint of tool 10 is dramatically reduced as compared to a conventional tool lacking this overlap.

End effector 77 is coupled to arm 75 preferably via a rotatable connection so that the end effector 77 can be twisted horizontally, vertically, or at any desired orientation comprising both horizontal and vertical components. This facilitates transport of wafers between FOUPs 40 and carriers 72 inasmuch as the substrates may be typically housed horizontally in the FOUPs 40 but at least substantially vertically in the carriers 72. End effector 77 may be designed to handle batches of substrates 74 and/or single substrates 74. Preferably, end effector 77 may handle substrates 74 individually using edge gripping capabilities.

The end effector 77 of wafer transfer robot 70 optionally may be two sided, e.g., having the ability to grip a substrate 74 from either side of the end effector 77. Such an end effector can pick up substrates 74 in one orientation using one side of the end effector 77 for clean substrates 74 and then be flipped 180 degrees to pick up dirty substrates 74 with the other side of the end effector. Advantageously, this will help reduce contamination transfer from dirty to clean substrates 74.

It is preferred that the end effector 77 be equipped with sensing capability, preferably optical sensing capability, to map wafers in FOUPs 40 and/or carriers 72. Wafer mapping generally refers to a procedure by which substrates held in a holder, such as a FOUP 40 or carrier 72, are scanned to determine what positions of the holder are occupied by substrates and whether any of such substrates are misplaced such as by cross-slotting, double-slotting, or the like.

Carrier transfer robot 76 in a preferred embodiment is in the form of a multiple-axis gantry that generally includes at least an x-axis slide 78 and a z-axis slide 80. End effector 82 on z-axis slide 80 is used to engage carriers 72. In operation, z-axis slide 80 can move horizontally back and forth to any desired position along a length of x-axis slide 78, while end effector 82 can move up and down to any desired position along a length of z-axis slide 80. This dual-axis movement allows end effector 82 to be positioned and/or moved along a pathway over a wide range of desired x-z coordinate positions within wafer transfer system 68. Advantageously, this allows multiple "levels" of the wafer transfer system 68 to be used for substrate handling/storage/processing operations. Use of the z-axis dimension to provide wafer transfer system 68 with multiple levels allows different aspects of the wafer transfer system 68 to be stacked vertically instead of spread out horizontally. This exploitation of the z-axis dramatically minimizes the footprint of the wafer transfer system 68 and is another way in which both the x-axis and y-axis dimensions of tool 10 are reduced as compared to conventional tools in which wafer transfer operations are carried out predominantly on only a single level.

Figure 7:
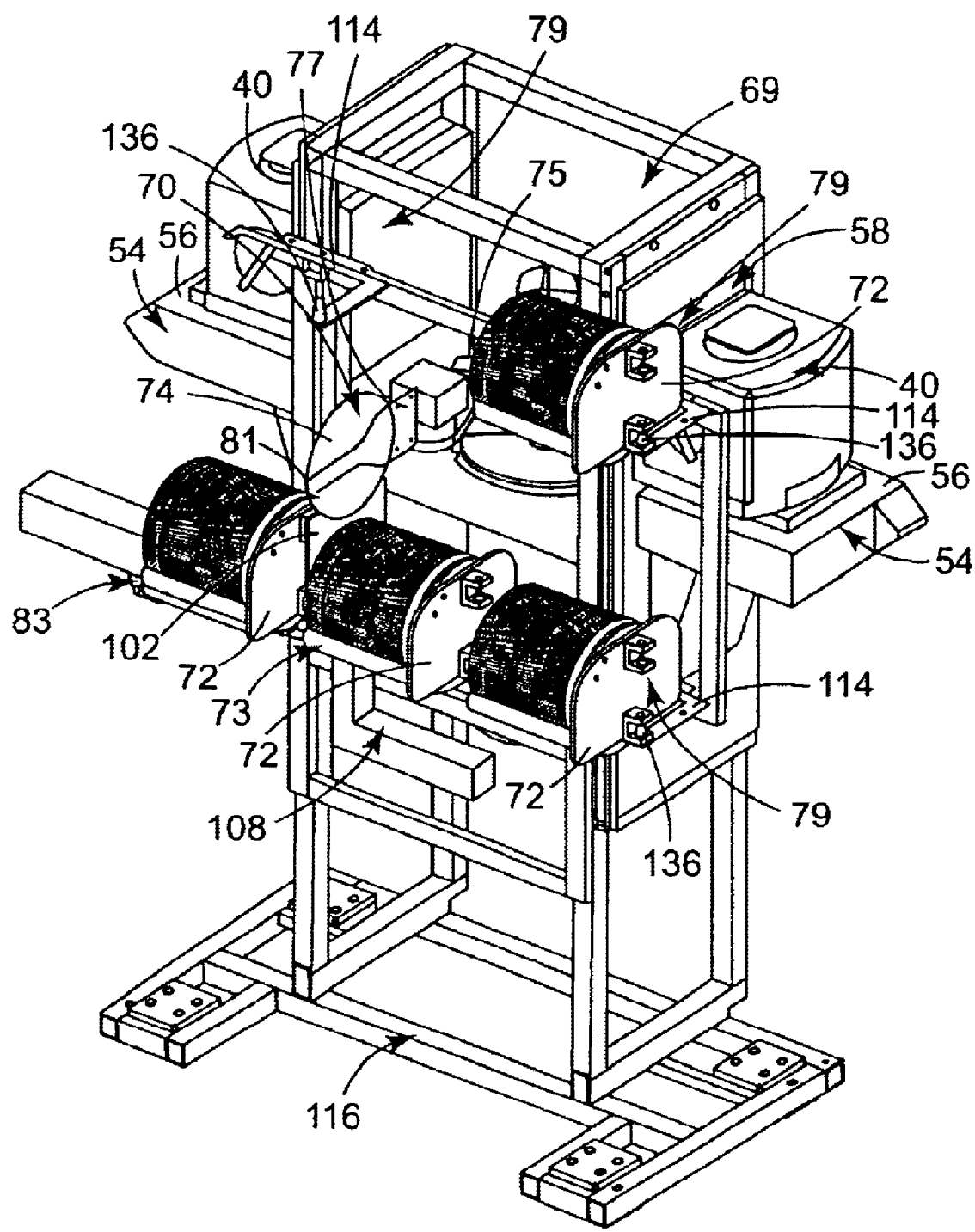
FIG. 7 is a perspective view of a portion of the wafer transfer system incorporated into the tool of FIG. 1 shown in combination with an opposed pair of PDO assemblies coupled to the wafer transfer system.
Figure 8:
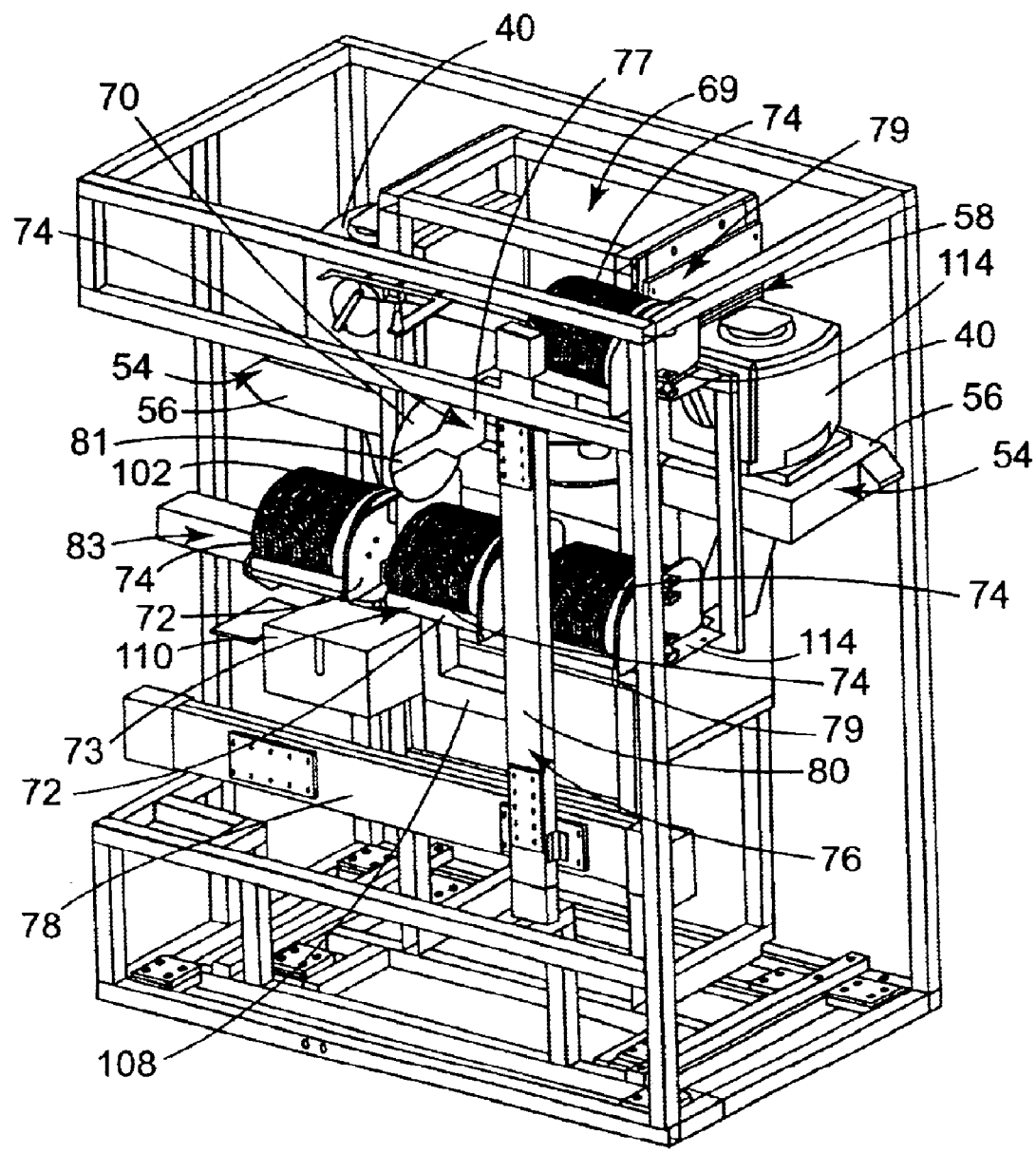
FIG. 8 is another perspective view of a portion of the wafer transfer system incorporated into the tool of FIG. 1 shown in combination with an opposed pair of PDO assemblies coupled to the wafer transfer system.

FIGS. 7 and 8 best illustrate the versatile manner by which wafer transfer system 68 may exploit the z-axis to accommodate significant substrate handling operations over a relatively small x-y footprint. As illustrated, wafer transfer system 68 may include a batching station 73 at which substrates 74 may be loaded (i.e., batched) and unloaded (i.e., unhatched) into a carrier 72. In addition to the supply of substrates 74 being batched (or unhatched) at batching station 73, one or more carriers 72 storing additional, batched, in-process substrates 74 may be stored at one or more storage buffer stations 79 located at the same or higher levels of wafer transfer system 68. Use of such higher levels can advantageously reduce the overall footprint of the tool 10 as compared to conventional tools in which storage locals are all at the same level. For purposes of illustration, one batched supply of substrates 74 is shown as being stored at the buffer station 79 located proximal to and at the same level as batching station 73. Another batch of substrates 74 supported upon a carrier 72 is being stored at one of the upper buffer stations 79, while another one of the upper buffer stations 79 is open and unoccupied. A carrier 72 storing substrates 74 may also be stored at hand off station 83, which is within the operational reach of process zone robot 94 for pick up of substrates 74 before processing and drop off of the substrates 74 after processing.

Figure 10:
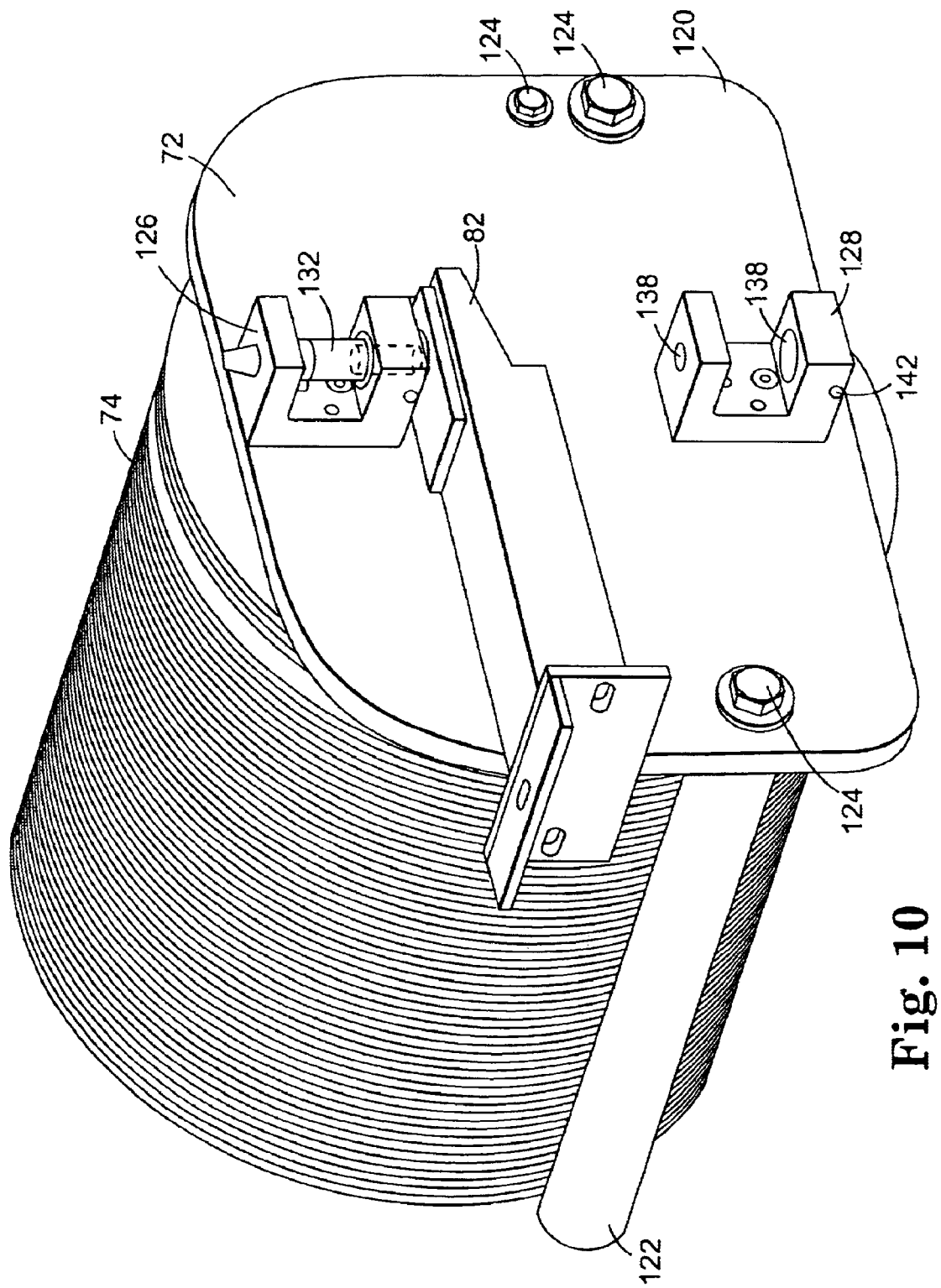
FIG. 10 is a perspective view showing a robot end effector holding a carrier used in the wafer transfer system of FIG. 1, wherein a batch of substrates is supported in the carrier.
Figure 11:
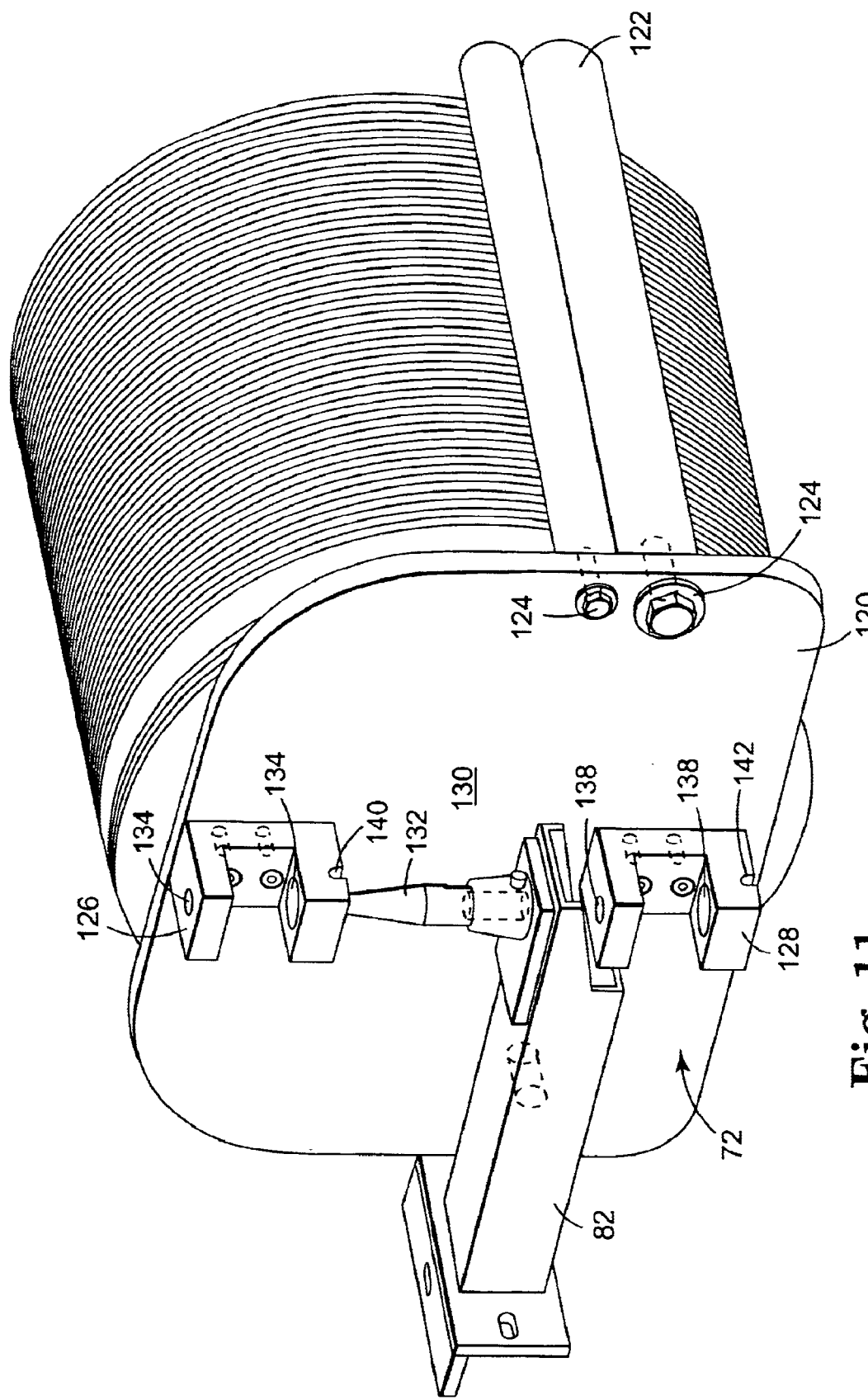
FIG. 11 is another perspective view of the carrier of FIG. 10, showing the coupling mechanisms between the end effector and the carrier in more detail.

A preferred embodiment of carrier 72 supporting a batch of substrates 74 is shown best in FIGS. 10 and 11. Carrier 72 includes side plate 120 and projecting arms 122 extending from side plate 120. Arms 122 optionally may be slotted to help hold substrates 74 more securely. The arms 122 are rigidly connected to the plate 120 by any suitable attachment technique such as by bolts, screws, threaded engagement, glue, welds, rivets, brackets, and the like to help ensure that the substrates 74 are securely and stably supported. For purposes of illustration, one or more bolts 124 are used. Brackets 126 and 128 are mounted to plate 120. Brackets 126 and 128 provide means by which carrier 72 may engage end effector 82 and shelves 114, respectively. Upper bracket 126 has provided therein holes 134 that are designed to releasably receive tapered post 132 of end effector 82, allowing end effector 82 to pick up carrier 72. One or more pins 130 project outward from the base of post 132 and engage one or more corresponding aperatures 140 in bracket 126 to help prevent carrier 72 from rotating about post 130. Lower bracket 128 is provided to releasably receive tapered post 136 of a shelf 114. Like post 130, the base of post 136 also includes pin(s) (not shown) to engage corresponding aperture(s) 142 on bracket 128 to help prevent carrier 72 from rotating about post 136. The carriers 72 may also be referred to in the art as "furniture".

FIGS. 10 and 11 best show how each carrier 72 preferably holds not just a batch of processable substrates 74, but also a suitable supply of one or more, typically at least two or more, preferably at least 4 or more, so-called "filler" or "dummy" wafers 74'. A supply of filler wafers 74' generally stays in each carrier 72 and may be used during batching to fill empty slots and/or cap the ends of a batched supply of substrates 74, as desired. When processed substrates 74 are being unbatched, any such cap or filler filler wafers 74' can be returned to their storage positions in the corresponding carrier 72 so as to be available for use in subsequent processing operations.

Typically, multiple carriers 72, are desirably located within the wafer transfer system 68 to allow multiple batches of substrates 74 to be in-process at any one time. These are typically stored at positions reachable by the carrier transport robot 76. It is desirable to have at least one more available storage position than the number of carriers 72 so that carriers can be moved about the wafer transfer system 68 from one locale to another as desired.

Figure 6:
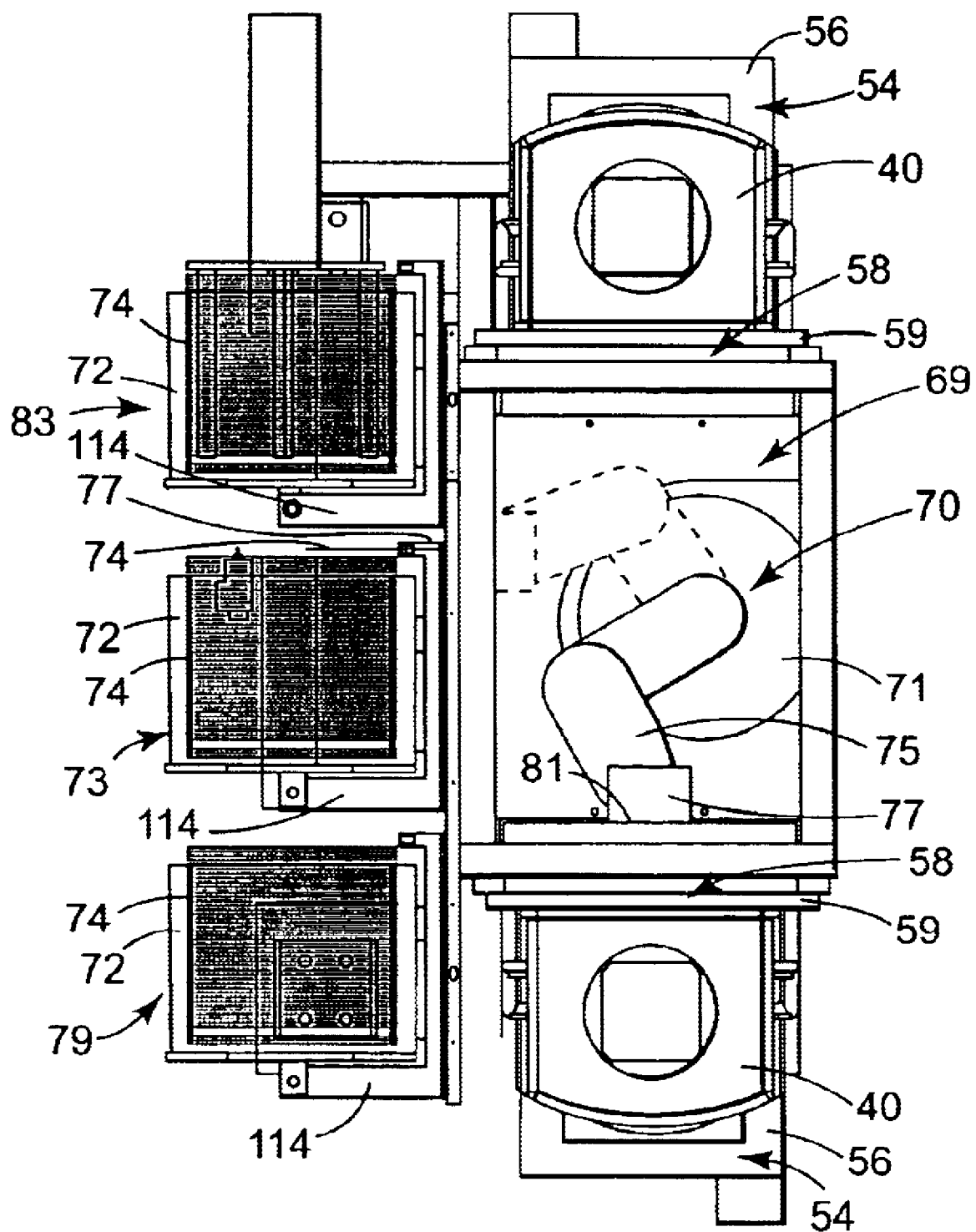
FIG. 6 is a top view of portions of the wafer transfer system incorporated into the tool of FIG. 1 in combination with an opposed pair of PDO assemblies coupled to the wafer transfer system.

FIGS. 6–8, best illustrate preferred embodiments of shelves 114, each of which may be used to releasably hold a respective carrier 72 from time to time at one of stations 73, 79 or 83. In the preferred embodiment shown, each shelf 114 is generally u-shaped. Each shelf 114 desirably includes an upwardly projecting, tapered post 136 that kinematically engages corresponding apertures 138 of bracket 128 on carrier 72. The tapered post 136 preferably engages the apertures 138 in a nonrotatable manner. Because of this nonrotatable engagement capability, such a kinematic coupling can advantageously position the carrier 72 accurately such that the end effector 82 can easily pickup and drop off the carrier 72. In other words, hand-off and pick-up capability or the like may be built into the coupling itself. Accordingly, because the coupling is more accommodating to less precise interaction with the robot end effector, the precision of the robot having the end effector 82 may be less critical. As such the cost of a suitable robot and/or its calibration, programming, or the like may be significantly reduced. As noted above, each post 136 includes one or more alignment pins (not shown) that engage one or more corresponding apertures 142 of bracket 128 on carrier 72 to help hold the carrier 72 in proper alignment on shelf 114 for pick up and drop off by end effector 82. The carriers 72 are generally moveable within wafer transfer system 68, while shelves 114 are generally fixedly secured in position.

A single wafer elevator 102 may be used at the batching location 73 to help lower substrates 74 into (i.e., batch) and/or lift substrates 74 from (i.e., unbatch) a carrier 72. The single wafer elevator 102 is typically in the form of a vertical plate having a suitable thickness so that it can fit between two batched substrates 74 on either side of an open carrier position. In other words, for any given three consecutive substrate holding positions in a carrier 72, the elevator 102 can fit into the open space when only the first and third of such holding positions are occupied. The elevator 102 also may optionally include componentry (described further below) that can rotate substrates 74 for alignment purposes. For example, the edges of some substrates 74 are notched in accordance with industry standards, and it may be desirable to align such notches to a desired angular orientation for processing. As an alternative to using components of the elevator 102 to accomplish notch alignment within the vertical stack of substrates 74 being loaded into a carrier 72, a conventional batch notch aligner can be used to rotate the wafer stack and catch the notch on each wafer, thus stopping its rotation, until all the notches have been caught. The stack as a whole can then be rotated until all the notches are oriented in the desired position.

Figure 9:
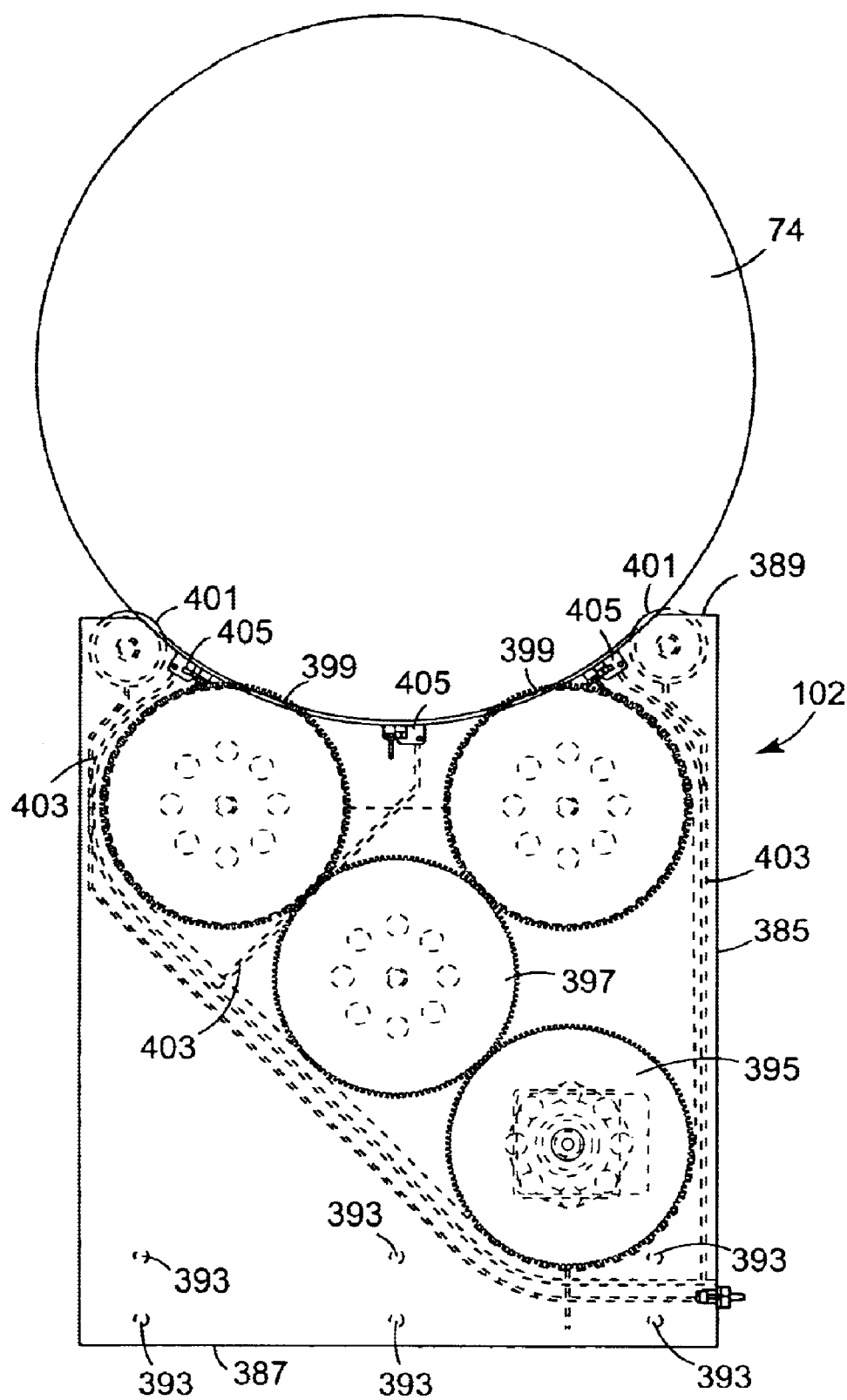
FIG. 9 is a cut-away, side view of a single wafer elevator used in the wafer transfer system of FIG. 1, shown as supporting a substrate.

FIG. 9 is a more detailed view showing the elevator 102 supporting a substrate 74. Elevator 102 generally includes a body 385 including a bottom end 387 and a top end 389. Body 385 includes mounting holes 393 to allow elevator 102 to be coupled to a suitable mechanism that can be used to move elevator 102 in the x, y, and/or z directions as desired. At top end 389, substrate rotating gears 399 and guide rollers 401 frictionally engage a supported edge of substrate 74. Rotation of gears 399 causes corresponding rotation of substrate 74, allowing substrate 74 to be rotated to a desired angular orientation. Motor driven gear 395 is rotationally coupled to substrate rotating gears 399 via idler gear 397. A moderate vacuum is established proximal to gears 399 and rollers 401 through vacuum conduits 405. A vacuum may be established in conduits 405 via vacuum coupling 403 in order to help remove particles that might be generated by engagement between a substrate 74 and elevator 102.

Elevator 102 and/or the elevator mechanism operatively supporting elevator 102 optionally may include sensing capability (not shown) to allow elevator 102 and/or such elevator mechanism also to be used to scan, e.g., map, substrates 74 supported in a carrier 72 at batching station 73. In such embodiments, the underside of batched substrates 74 could be easily scanned and mapped. Elevator 102 may be translatable to facilitate such scanning. Such translation capabilities may also be used to move elevator 102 from position to position for purposes of batching and unbatching substrates 74 to and from carrier 72.

The elevator 102 generally has a range of vertical motion extending from a raised position to a lowered position. In the raised position, a substrate 74 is supported far enough above the carrier 72 to allow the substrate 74 to be gripped by the end effector 77 of wafer transfer robot 70. In this position, the substrate 74 can be placed onto or taken from the single wafer elevator 102. In the lowered position, a substrate 74 is lowered into a supported position in carrier 72. To allow the elevator 102 to help handle the next substrate to be placed into (or taken from, as the case may be) carrier 72, indexing elevator 108 is indexed over to the next position and/or carrier transfer robot 76 may shift carrier 72 over enough to bring the elevator 102 into operative alignment with the next substrate position. Advantageously, such motion capabilities allow batching and unbatching to be performed by using plural vertically disposed buffer stations 79 rather than only horizontally disposed buffer stations 79 as substrates 74 can advantageously be transferred between such vertically arranged buffers stations 79. Accordingly, use of such vertically disposed buffer stations 79 can advantageously reduce the overall footprint of the tool 10 as compared to conventional tools.

In alternative embodiments, multiple elevators 102 may be used in concert or integrated into a single larger elevator system to cooperatively batch and unbatch groups of substrates 74. For example, if end effector 77 is capable of handling groups of substrates 74 at any one time, a corresponding number of elevators 102 or a larger integrated elevator may be present to assist with batching and unbatching those groups. Advantageously, each such elevator 102, or such larger integrated elevator, would be able to independently align a corresponding substrate 72 of a group during batching operations.

A wash station 110 optionally is located in the wafer transfer system 68 to rinse and dry end effectors 77, 82, and/or 100 and/or carriers 72 in accordance with conventional practices. This can be done in order to remove chemical residues, liquids, particles, or the like before end effectors 77, 82, and/or 100 are used to handle additional substrates 74.

Referring again to FIGS. 1 through 11, collectively, processing zone 84 generally provides a working space in which one or more substrates 74 are subjected to one or more process treatments, typically while being supported in a carrier 72. For purposes of illustration, processing zone 84 of tool 10 includes three different processing stations 88, 89, and 90, although other embodiments may include lesser or greater numbers of such stations, as desired. Processing stations 88, 89, and 90 are shown as being arranged in linear fashion along the y-axis direction 28, but other orientations may be used. For example, processing stations may be arranged along the x-axis direction 26, stacked in the z-axis direction 30, arranged in a cluster, and/or the like.

Typically, one or more suitable processing zone robots may be used to convey substrates 74 to and from the processing zone 84 and/or among the various process stations 88, 89, and 90. As shown, a single processing zone robot 94 preferably provides these capabilities. Robot 94 preferably is in the form of a multiple axis gantry and includes a y-axis slide 96 that extends along the y-axis direction 27 so that each of processing stations 88, 89, and 90 is within the operational reach of robot 94. Robot 94 includes z-axis slide 98 that is moveable back and forth along the length of y-axis slide 96. End effector 100 is mounted on z-axis slide 98 and can move up and down along the length of the z-axis slide 98 sufficiently to handle batches of substrates 74 in the desired manner. Optionally, end effector 100 may be coupled to z-axis slide 98 on a telescoping, articulating, or other moveable support 112 to allow robot 94 to have x-y-z motion capability. At one end of y-axis slide 96, the z-axis slide 98 is positioned proximal to wafer transfer system 68, or even within wafer transfer system 68 in some embodiments, so that end effector 100 can pick up carriers 72 for processing or drop off carriers 72 after processing. In other respective positions along the length of y-axis slide 96, end effector 100 can convey carriers 72 to and from processing stations 88, 89, and 90 for processing and pick up.

Preferably, a mini-environment is provided over the wafer transfer zone 68 and/or processing zone 84 to maintain a particle free air flow around the wafer batching robot, wafer stacks and the two gantry robots. Optional ionization grids (not shown) may also be used to prevent static charge buildup in accordance with conventional practices.

Tool 10, if desired, may be an assemblage of one or more modules to facilitate service, upgrade, or replacement of portions of tool 10. For example, dotted lines 38 show possible boundaries between optional modular components. In the particular illustrative embodiment shown, one module corresponds to a buffer zone 44, another module corresponds to a wafer transfer system 68, and one or more additional modules constitute a processing zone 84. Each of modular components constituting zones 44, 68, and 84 optionally may be further sub-divided into smaller modular components, if desired, to facilitate service, performance, upgrade, replacement, or the like. For example, processing zone 84 as shown is formed from one or more modular processing stations 88, 89, and 90.

In particular, in order to improve accessibility and maintenance of the components of the wafer transfer system, the two PDOs assemblies, the wafer transfer robot, its controller (not shown), and the furniture sets (e.g., carriers 72 and shelves 114 to support them) are preferably mounted on one or more respective roll-away, subassemblies 116, e.g., carts, that can easily removed from the tool for service, maintenance, upgrade, and/or replacement. This also provides access to the gantry-like robots 76 and 94 as well as the back of the buffer zone 44. The robot 62 within the buffer zone 44 may also be mounted on a cart(not shown) that can be pulled out through the rear of the buffer zone 44 into the space vacated by the wafer transfer system cart and thereby removed from the tool. Alignment features preferably are provided to help ensure that the carts lock back into the same positions once rolled back into place.

Automatic teach capability (or autocalibration) can be used to teach the various pick-up and drop-off locations for the buffer zone robot 62, the wafer transfer robot 70, the carrier transfer robot 76, and/or the process zone robot 94 to automate the tool set-up following assembly or maintenance.

In one representative mode of operation of tool 10 shown in FIGS. 1 through 6, a production line robot (not shown) or worker (not shown) may place a FOUP 40, which may house one or more processable substrates 74, onto one of load ports 34. Robot 62 reaches through the corresponding portal 42 to grip the FOUP 40 and brings the FOUP 40 inside buffer zone 44. In one mode of operation, the robot 62 may transfer the FOUP 40 to an open PDO assembly 54 where the FOUP operatively engages the airlock structure 59 of the PDO assembly 54. The airlock structure 59 is opened, providing egress into the FOUP 40 from inside wafer transfer system 68. In other modes, the FOUP 40 may be stored within buffer zone 44 prior to being transported to a PDO assembly 54.

As best shown by FIG. 6, once a FOUP 40 is engaged with the airlock structure 59, wafer transfer robot 70 transfers substrates 74 from the FOUP 40 to a carrier 72 positioned at the batching station 73. Substrates 74 may be transferred to the carrier 72 in batches or one at a time. Preferably, substrates 74 are transferred one at a time. In the case of single wafer transfer, after the wafer transfer robot 70 withdraws a substrate 74, the robot 70 rotates and turns to face the batching station 73. A wrist twist operation is carried out (either clockwise or counterclockwise, as the case may be) to turn the substrate 74 from a horizontal orientation to a vertical one. The robot 70 then places the substrate 74 onto the raised elevator 102 that helps support the vertical substrate 74. The elevator 102 then lowers the substrate 102 into the carrier 72. The elevator 102 or carrier 72 may be indexed over to locate the elevator 102 with the next empty position of the carrier 72 into which another substrate 72 will be placed. The process is continued until the desired number of substrates 74 is transferred to vertical stack held in the carrier 72 at batching station 73.

Industry standard FOUP's generally can hold up to 25 processable substrates 74. However, each carrier 72 may be designed with a greater capacity, e.g., some embodiments of carriers 72 may have the ability to hold 50 or more processable substrates 74 at one time. Accordingly, substrates 74 may be batched or unbatched from such a carrier 72 to and from one or more FOUP's 40 at one or more of PDO assemblies 54.

Substrates 74 may preferably be placed into the carrier 72 in a face-to-face and back-to-back order, with the device sides of each substrate 74 only facing the device sides of other substrates 74. This is easily accomplished by twisting the wristed end effector 77 in alternate directions, clockwise and counter clockwise before placing substrates 74 onto the elevator 102. Of course, substrates 74 may also be placed in a standard face-to-back orientation as well.

Robot 70 optionally may add additional filler wafers 74' to fill and/or cap a supply of batched substrates 74, if desired. Once the transfer from the FOUP(s) 40 to the carrier 72 is complete, the PDO assembly(ies) 54 is/are closed and disengaged from FOUP 40, and robot 62 stores the empty FOUP(s) 40 at convenient locale(s) inside buffer zone 44.

With the carrier 72 holding the desired number of substrates 74, the carrier transport robot 76 picks up the carrier 72 and may transfer the carrier 72 either to any of buffer positions 79 and then to the hand off station 83 or directly to the hand off station 83. At the hand off station 83, processing zone robot 94 picks up the batch of substrates 74, removing them from the carrier 72 and bringing them into processing zone 84 for processing. In the meantime, the now-empty carrier 72 can be taken from the hand off position 83 and stored in wafer transfer zone 68 until needed, washed in wash station 110, or transferred directly back to the batching station 73 for additional use.

Once the processing of substrates 74 is completed in the desired manner, robot 94 returns the batch of substrates 74 to an empty carrier 72 waiting at the hand off station 83. Carrier transport robot 76 may then transfer the processed batch of substrates 74 in the carrier 72 either to a buffer position 79 and then to the batching station or directly back to the batching station 73. At the batching station 73, wafer transfer robot 70 transfers the wafers back into one or more FOUP's through one or both of PDO assemblies 54. When the unbatching is complete for each such FOUP 40, buffer zone robot 62 transfers the FOUP 40 either to a storage location and then out to a load port 34 for pick up or directly to load port 34 for pick up.

The above mode of operation was described in connection with how one batch of substrates 74 might be handled within tool 10. In actual practice, however, multiple batches will be at different stages of processing within tool 10 in order to more fully utilize the capacity of tool 10. Thus, for instance, at any one time, one batch of substrates might be undergoing loading to and/or from a carrier 72 at the batching station 73, one or more other batches might be undergoing storage on a shelf 114 or the like within wafer transfer system 68 awaiting further handling or processing, one or more batches may be undergoing storage or handling within buffer zone 44, and/or one or more other batches may be undergoing processing at stations 88, 89, and/or 90.

Figure 14:
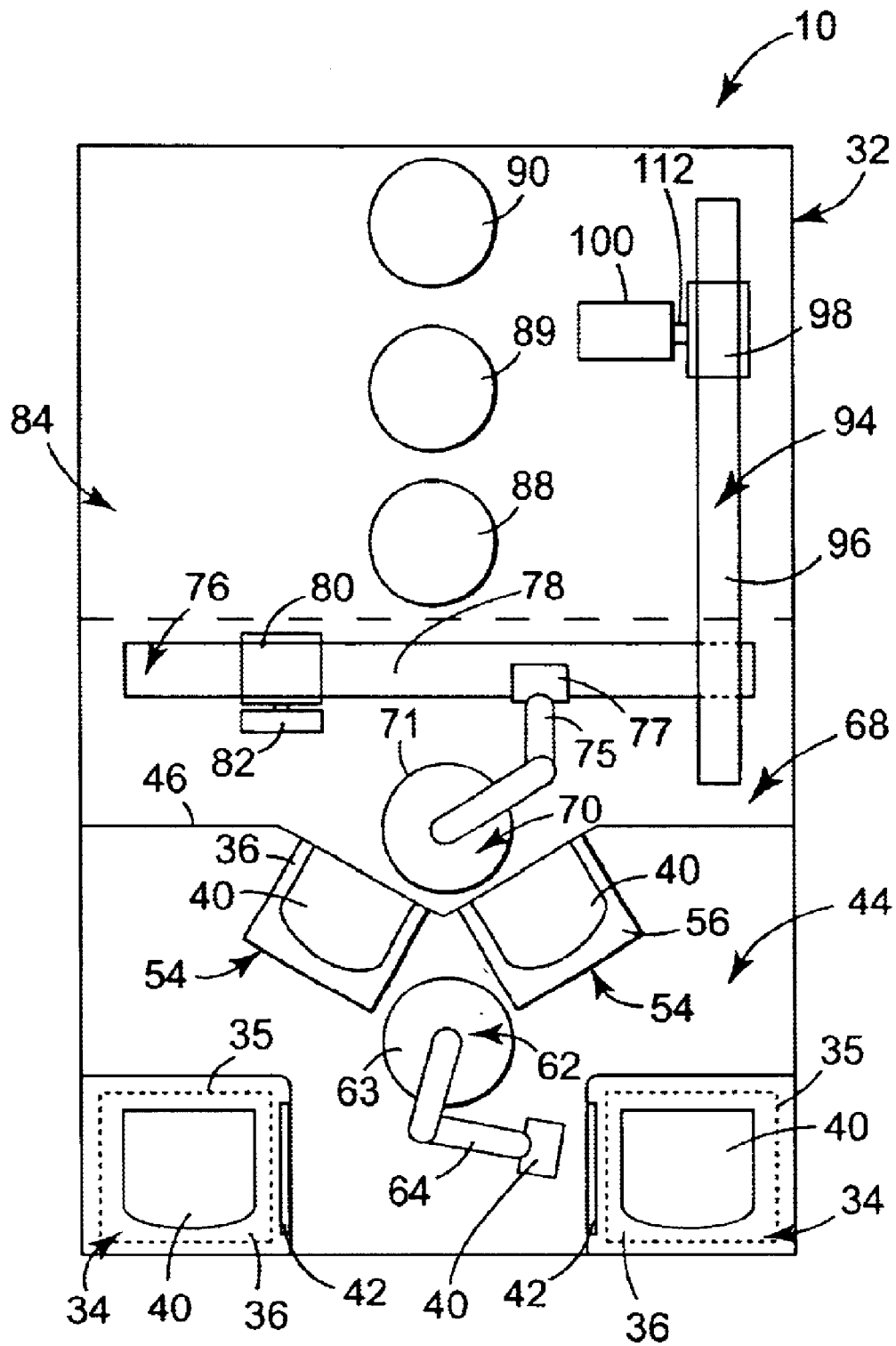
FIG. 14 is an alternative embodiment of a tool of the present invention.

FIGS. 12 through 14 illustrate alternative embodiments of the invention showing other ways in which overlapping tool functions can be provided to reduce tool footprint without unduly compromising throughput. In each of FIGS. 12 through 14, the same numbering scheme is used to identify features that are generally the same as the embodiment of tool 10 shown in FIGS. 1 through 11.

FIG. 12 shows an embodiment in which a single PDO assembly 54 is provided for access to and from wafer transfer system 68 and buffer zone 44. The portion of wafer transfer system 68 housing wafer transfer robot 70 and the portion of buffer zone 44 housing the PDO assembly 54 overlap in the y-direction, helping to reduce the y-dimension of the tool.

FIG. 13 shows an embodiment in which a single PDO assembly 54 provides access to and from wafer transfer system 68 and buffer zone 44. In this embodiment, PDO assembly 54 is on the front face of partition 46. However, the portion of buffer zone 44 occupied by buffer zone robot 62 overlaps the portion of wafer transfer system 68 housing the wafer transfer robot 70 in the y-direction, helping to reduce the y-dimension of the tool.

FIG. 14 shows an embodiment in which a pair of PDO assemblies 54 provide access to and from wafer transfer system 68. The pair of PDO assemblies 54 are disposed at an angle against partition 46 so as to define a pocket between them. The portion of buffer zone 44 housing buffer zone robot 62 occupies a portion of this pocket such that a portion of buffer zone 44 overlaps a portion of buffer zone 44 housing the PDO assemblies 54. This overlap of buffer zone robot and PDO assembly functions helps to reduce the overall y-dimension of the tool 10.

Other embodiments of this invention will be apparent to those skilled in the art upon consideration of this specification or from practice of the invention disclosed herein.

Various omissions, modifications, and changes to the principles and embodiments described herein may be made by one skilled in the art without departing from the true scope and spirit of the invention which is indicated by the following claims.

What is claimed is:

1. An apparatus for processing microelectronic substrates, the apparatus comprising:

first and second substrate handling zones;

a first overlap region of the first zone that overlaps with a second overlap region of the second zone in a y-axis dimension of the apparatus;

a partition at least partially suparating the first zone from the second zone;

a passage between the first zone and the second zone formed at least partially in the partition and capable of passing one or more substrates between the first zone and the second zone;

a carrier handling robot positioned in the first zone such that the carrier handling robot is capable of positioning a carrier in the overlap region of the first zone; and at least one substrate handling robot positioned at least partially within the overlap region of the second zone such that the robot is capable of transporting one or more substrates between the carrier in the first zone and the second zone.

2. The apparatus of claim 1, wherein the first zone further comprises at least one portal through which one or more carriers can be transferred between outside of the apparatus and the first zone.

3. The apparatus of claim 2, wherein the carrier handling robot positioned within the first zone is capable of transporting the one or more carriers between the outside of the apparatus and the first zone.

4. The apparatus of claim 1, further comprising at least one processing zone adjacent the second zone and including at least one substrate processing station.

5. The apparatus of claim 4, wherein the apparatus comprises a wafer transfer system capable of transferring one or more substrates from the second zone to the processing zone.

6. The apparatus of claim 5, wherein at least a portion of the wafer transfer system is operatively positioned within the second zone and at least a portion of the wafer transfer system is operatively positioned within the processing zone.

7. The apparatus of claim 1, wherein the at least one partition separates the first zone from the second zone such that an environment in the first zone can be separately controlled from an environment in the second zone.

8. The apparatus of claim 1, wherein the at least one passage between the first zone and the second zone comprises a pod door opener assembly.

9. The apparatus of claim 1, wherein the passage between the first zone and the second zone comprises a passage between the overlap region of the first zone and the overlap region of the second zone.

10. The apparatus of claim 1, wherein the passage between the first zone and the second zone comprises a passage between the first zone and the overlap region of the second zone.

11. The apparatus of claim 1, wherein the passage between the first zone and the second zone comprises a passage between the second zone and the overlap region of the first zone.

12. The apparatus of claim 1, further comprising at least one additional passage between the first zone and the second zone.

13. A tool for processing microelectronic substrates, the tool comprising:

first and second substantially opposed portals providing egress between a first zone and a second zone, wherein the first portal comprises a first side for loading and unloading carriers and a second side for loading or unloading substrates; and the second portal comprises a first side for loading and unloading carriers and a second side for loading or unloading substrates; and at least one substrate handling robot disposed at least partially between the portals and having a range of motion such that the robot is capable of transporting substrates between the first and second zones; and a carrier handling robot positioned in the first zone such that the carrier handling robot is capable of loading and unloading carriers to the first side of either the first or second portals.

14. A tool useful in the manufacture of microelectronic substrates, the tool comprising:

a processing zone comprising at least one process station in which at least one in-process microelectronic substrate is subjected to a process treatment;

a buffer zone comprising at a carrier handling robot operable with least one portal through which one or more in-process microelectronic substrates can be transferred into and taken from the tool; and a wafer transfer system comprising:

at least a portion of one or more pathways along which one or more in-process microelectronic substrates can be transferred from the buffer zone to the processing zone;

a portion that overlaps a portion or the buffer zone in a y-axis dimension and at least one substrate handling robot positioned at least partially within the portion that overlaps a portion of the buffer zone in a y-axis dimension;

wherein first and second, opposed sidewalls extend at least partially in the y-direction and form respective barriers between the overlapping portions of the buffer zone and the wafer transfer system, wherein at least one of the sidewalls comprises at least one portal through which one or more in-process microelectronic substrates can be transported between the buffer zone and the wafer transfer system by said at least one substrate handling robot, wherein the at least one portal comprises a first side for loading and unloading carriers and a second side for loading or unloading microelectronic substrates.

15. The apparatus of claim 1, wherein the carrier handling robot positioned in the first zone is capable of positioning a first and second carrier in the overlap region of the first zone such that the first and second carriers are simultaneously positioned in the overlap region of the first zone, and wherein the substrate handing robot is capable of:

transporting one or more substrates between the first carrier in the first zone and the second zone; and transporting one or more substrates between the second carrier in the first zone and the second zone.

16. The apparatus of claim 14, wherein the carriers are front opening unified pods (FOUPs).

17. The apparatus of claim 1, wherein the carrier is a front opening unified pod (FOUP).

18. The apparatus of claim 13, wherein the carriers are a front opening unified pod (FOUPs).

* * * * *

UNITED STATES PATENT AND TRADEMARK OFFICE
CERTIFICATE OF CORRECTION

PATENT NO. : 6,979,165 B2
APPLICATION NO. : 10/292147
DATED : December 27, 2005
INVENTOR(S) : Larson et al.

It is certified that error appears in the above-identified patent and that said Letters Patent is hereby corrected as shown below:

Column 3,
Lines 23-24, "by a fixed" should be -- by fixed --.

Column 7,
Lines 24 and 25, "unhatched" should be -- unbatched --.

Column 8,
Line 9, "cap or filler filler wafers" should be -- cap or filler wafers --.

Column 9,
Line 47, "buffers" should be -- buffer --.

Column 13,
Line 14, "suparating" should be -- separating --.

Column 14,
Line 24, "comprising at a carrier" should be -- comprising a carrier --.
Line 25, "with least" should be -- with at least --.
Line 33, "portion or the" should be -- portion of the --.

Signed and Sealed this

Twentieth Day of June, 2006

JON W. DUDAS
*Director of the United States Patent and Trademark Office*